United States Patent

Giuliano et al.

[15] 3,684,902

[45] Aug. 15, 1972

[54] SEMICONDUCTOR SWITCH DEVICE

[72] Inventors: Michael N. Giuliano, Baltimore, Md.; Elwood W. Goins, Fishkill, N.Y.

[73] Assignee: Westinghouse Electric Corporation, Pittsburgh, Pa.

[22] Filed: June 7, 1966

[21] Appl. No.: 555,795

Related U.S. Application Data

[63] Continuation of Ser. No. 176,723, March 1, 1962, abandoned.

[52] U.S. Cl. .................................. 307/303, 317/235
[51] Int. Cl. ............................................... H01l 9/00
[58] Field of Search .............................. 317/234, 235

[56] References Cited

UNITED STATES PATENTS

| | | | |
|---|---|---|---|
| 3,237,018 | 2/1966 | Leger | 307/303 |
| 3,241,013 | 3/1966 | Evans | 317/235 |

*Primary Examiner*—James D. Kallam
*Attorney*—F. Shapoe, C. L. Menzemer and G. H. Telfer

[57] ABSTRACT

A switching device is provided in a semiconductor structure including a first region with three regions in rectifying contact therewith and, additionally, an ohmic contact thereon. Two of the rectifying contacts are symmetrically disposed with respect to the third and to the ohmic contact on the first region to provide the equivalent of two matched transistors having common emitter and base regions. The ohmic contact on the first region may, for example, be located between or extend around the two symmetrically disposed rectifying contacts, or have an "E" or "H" shape, or it may extend around the third rectifying contact. When a switching signal is applied across the ohmic contact on the first region and the third rectifying contact a low impedance path is provided between the other two rectifying contacts.

2 Claims, 8 Drawing Figures

INVENTORS
Michael N. Giuliano and
Elwood W. Goins
BY
Gordon H Telfer
ATTORNEY

SEMICONDUCTOR SWITCH DEVICE

This application is a continuation of application Ser. No. 176,723, filed Mar. 1, 1962, now abandoned.

This invention relates to semiconductor devices which in association with appropriate circuitry perform switching functions and, more particularly, this invention relates to semiconductor devices capable of formation to provide either single-pole, single throw operation or single-pole, multithrow operation for either AC or DC signals.

Presently known mechanical and electro-mechanical switches generally exhibit a slow switching time due to the necessity to move a relatively large mass and, also, they exhibit a lack of reliability because the mechanical movement necessarily causes wear.

Semiconductor devices have been developed which generally avoid the objections to mechanical switches at least at moderate power levels. However, applications still exist which require easily fabricated switches which switch to a low impedance level at very high speed, whose switching characteristics are not unduly altered by temperature variations, whose operation is such that both AC and DC signals may be switched and which revert to the off condition upon removal of the switching signal.

It is, therefore, an object of the present invention to provide an improved switch device which is characterized by long life and fast switching time.

Another object is to provide an improved semiconductor switch device which is capable of switching AC signals as well as DC signals.

Another object is to provide an easily fabricated semiconductor switch device which incorporates within a unitary body of material the electronic function of a plurality of precisely matched transistors.

In accordance with the present invention, a semiconductor switch device is provided which comprises a unitary body of semiconductive material having a center region with first, second and third rectifying contacts thereon. Means are associated with the unitary body to impose a bias potential difference between a first and second rectifying contact and, also, means are provided to apply a switching signal between the bulk material and the third rectifying contact. The result is that an input signal applied to the first rectifying contact can appear as an output signal at the second rectifying contact so long as the switching signal is applied. This is because the switching signal reduces the impedance through the unitary body between the first and second rectifying contacts to a low level.

The device may also be described as equivalent to two transistors having a common base region and one common region in rectifying contact with the base region and serving as the emitter of both of the transistors. First and second separate regions are also provided in rectifying contact with the common base region to serve as the collectors. In either case, the application of the switching signal drives the transistors into saturation and a conductive path is provided through the body in both directions.

By fabricating the structure from a unitary body of material and by forming the first and second separate regions the same and locating them symmetrically with respect to the third or common region and with respect to the base contact, there results a device approximately equivalent to a pair of precisely matched transistors which will operate with the same characteristics despite temperature variations.

Where the device comprises only the above-mentioned base region with three rectifying contacts, single-pole, single throw operation is provided. For single-pole, multithrow operation a plurality of devices as above described may be fabricated together to provide matching characteristics. For a single-pole, double throw switch, for example, a device including two portions each like the above described single-pole, single throw device and having a common rectifying contact which serves as the common terminal to which a signal is to be switched from either the separate rectifying contact on the first device portion or the separate rectifying contact on the second device portion.

The features of the present invention which are believed to be novel are set forth with particularity in the appended claims. The present invention, both as to its organization and manner of operation, together with the above-mentioned and further objects and advantages thereof, may best be understood by reference to the following description taken in connection with the accompanying drawings, in which:

Figure 1:
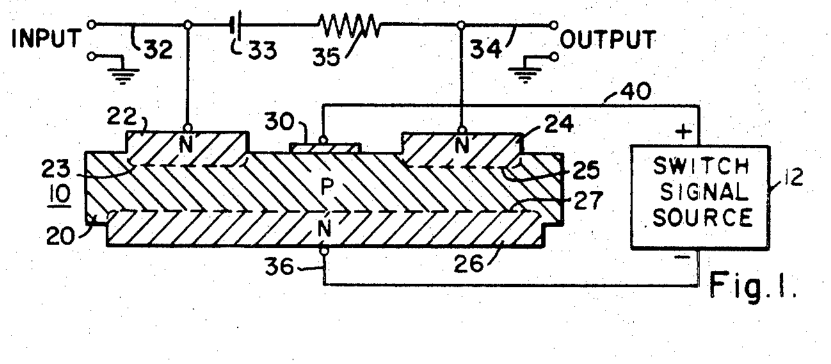
FIG. 1 is a cross sectional view of a device according to this invention with schematic of associated circuitry.
Figure 2:
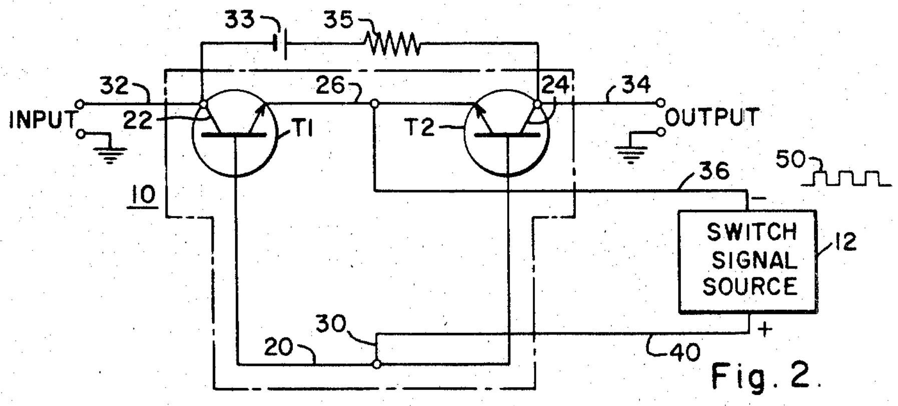
FIG. 2 is a schematic of the approximate equivalent circuit of FIG. 1.

The invention will now be described in a single-pole, single throw embodiment as shown in FIGS. 1 and 2. The function of the device and circuit shown is to permit conduction through the unitary semiconductor body 10 between the input and the output only when the switch signal source 12 applies a signal to the device 10.

The device 10 consists of a bulk material 20 of one type of semiconductivity, here shown as p-type, with first, second and third rectifying contacts 22, 24 and 26 thereon. The rectifying contacts 22, 24 and 26 are regions of oppositely doped, or n-type material, each of which forms a p-n junction 23, 25 and 27 with the bulk material 20. An ohmic contact 30 is provided on the bulk material 20 between the first and second rectifying contacts 22 and 24 and opposite the third rectifying contact 26. This ohmic contact 30 permits electrical connection to be made to the bulk material 20. Connection may be made directly to the rectifying contacts 22, 24 and 26 inasmuch as they may comprise fused metal alloy foils. A first lead 32 joined to the first rectifying contact 22 serves as the input to the device 10. A second lead 34 joined to the second rectifying contact 24 serves as the output from the device 10. Between the first and second leads 32 and 34 is provided means for establishing a bias potential between the two rectifying contacts 22 and 24. As here shown, this means includes a DC potential source 33 and a resistance 35 of substantial value. A third lead 36 to the third rectifying contact 26 and a fourth lead 40 to the ohmic contact 30 are applied across a switch signal source 12 which applies a suitable signal such as a timed triggering pulse.

In FIG. 2, in which the reference numerals correspond to those of FIG. 1, the device 10 of FIG. 1 is shown as substantially equivalent to two transistors T1 and T2. The dashed line encloses that portion of the equivalent circuit which is provided by the device 10. A first transistor equivalent T1 is comprised of the first rectifying contact 22, the bulk material 20 and the third rectifying contact 26 of the device 10. A second transistor equivalent T2 is comprised of the second rectifying contact 24, the bulk material 20 and the third rectifying contact 26. Hence, the two transistor equivalents T1 and T2 have the bulk material 20 and the third rectifying contact 26 as common regions. One explanation for the operation of the device 10 is that upon the application of a signal by the switch signal source 12, the two transistors T1 and T2 are driven into saturation with the result that a low impedance path is provided between the input and the output.

The signal applied by the switch signal source 12 should be such as to forward bias the junction 27 formed by the common rectifying contact 26 with the adjacent bulk material 20. This causes injection of minority carriers into the bulk material 20 through the third rectifying contact 26 and, if of sufficient magnitude, can drive the transistor equivalents T1 and T2 into saturation. For a p-n-p transistor, the polarity would, of course, be opposite.

As a general condition for operation, it may be said that for bilateral switch action, at least two of the three junctions of the device must be forward biased. In saturation all three of the junctions 23, 25 and 27 are forward biased while in cutoff one of the blocking junctions 23 or 25 is back biased.

It should be noted that the device of FIG. 1 consists of only three rectifying contacts 22, 24 and 26 on the bulk material 20. Electrical isolation from other devices is necessary for functioning as intended here, for example when the device of FIG. 1 is incorporated in a monolithic block including regions performing other device functions. However, within the structure shown there is not to be electrical isolation between the various portions. That is, a substantially uniform potential in the bulk material 20 during operation is desired. The uniform potential is conveniently achieved by disposing the third rectifying contact 26 in a relatively large area on the surface of the bulk material 20 opposite to the first and second rectifying contacts 22 and 24 and the ohmic contact 30. The uniform potential in the bulk material 20 results in high gain, that is, the ratio of controlled current (between contacts 22 and 24) to controlling current (applied to the third contact 26) is high.

Considering in detail now the operation of the device in FIG. 1, insofar as it is presently understood, upon application of a signal from the switch signal source 12, minority carriers (electrons in the p-n device shown) are injected by the common emitter 26 into the bulk material 20 and when the level of injection is sufficiently high the bulk material (base region) is said to be saturated. At this point of saturation, the blocking junction, which previously was reverse biased, assumes a forward bias. The device therefore passes from a high impedance state to a low impedance state when one looks across the two junctions 23 and 25. Because of the symmetrical arrangement of these junctions, the switch is bilateral.

In the device 10, it is important that the bulk material 20 have the same relationship to each of the contacts 22 and 24 and that the third rectifying contact 26 make a junction with the bulk material 20 which has uniform electrical characteristics over its entire area. Also, the first and second rectifying contacts 22 and 24 should be symmetrically formed relative to the third contact 26 and to the ohmic contact 30 on the bulk material 20. The symmetry referred to is, of course, about a vertical plane through the center of the device of FIG. 1. In this way, an equivalent transistor pair is provided with a common junction with closely matching characteristics. These matching characteristics mean that the characteristics of the two transistors will vary uniformly with respect to temperature, for example. Non-uniform temperature variation of characteristics is a primary problem making it difficult to fabricate individual transistors with matching characteristics. Hence, individual transistors are not highly practical for use in a circuit like that of FIG. 2, especially as regards thermal matching of characteristics. Matching characteristics, even at room temperature, are important for low offset voltage, that is, the voltage drop across the device when it is in the on condition. It id desirable that the portions of the device should have matching characteristics not only at room temperature but that over an appreciable temperature range they vary together. With unmatched transistors there will be switching but of poor quality, especially with regard to offset voltage and temperature variations.

Figure 5:
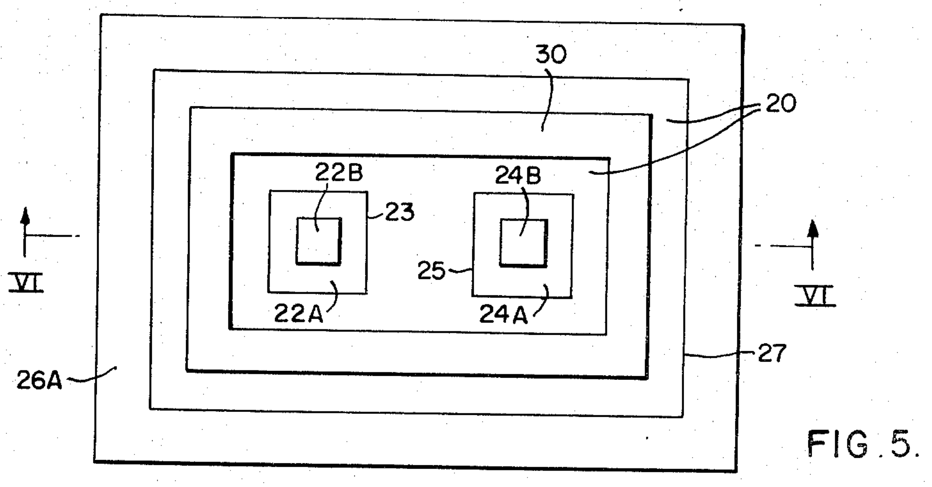
FIG. 5 is a plan view of an alternative embodiment of the present invention.
Figure 6:
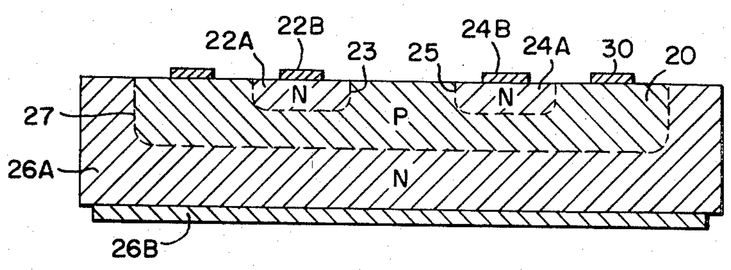
FIG. 6 is a sectional view taken along the line VI—VI of FIG. 5.
Figure 7:
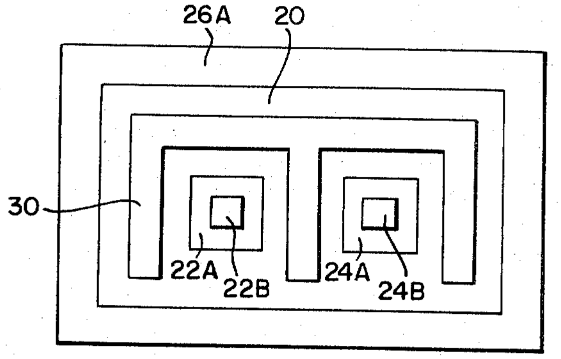
FIGS. 7 and 8 are plan views of additional embodiments of the invention.
Figure 8:
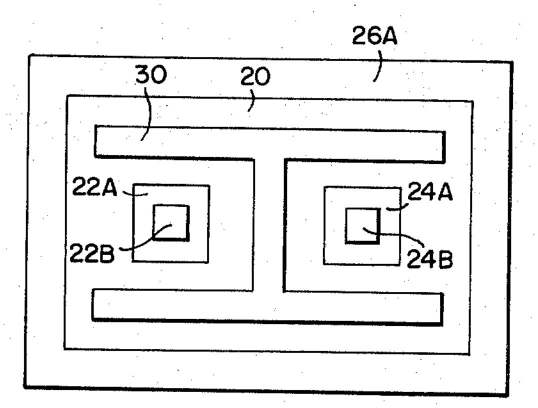

For a symmetrical device, necessary for good thermal characteristics the ohmic contact 30 may be disposed other than as shown in FIG. 1. For example, the contact may extend around the rectifying contacts 22 and 24 (as shown in FIGS. 5 and 6) or have an "E" or "H" shape on the upper surface (as shown in FIGS. 7 and 8, respectively) or it may extend around the common rectifying contact 26 on the lower surface. The necessary condition is that the common rectifying contact 26 and the ohmic contact 30 each have the same relationship to the two rectifying contacts 22 and 24. It is preferred that the rectifying contact 26 and the ohmic contact 30 be distributed over a relatively large portion of the bulk material 20 so that upon application of a switch signal substantially uniform potential is achieved in the bulk material.

The symmetry of the device 10 also permits operation between the two terminals 32 and 34 interchangeably. That is, the input and output terminals may be reversed from that shown in FIG. 1. Furthermore, the device will operate satisfactorily on AC signals applied to the input as well as DC signals. Also, the symmetry of the device permits the bias potential source 33 to be of either polarity when it is a DC source or it may be an AC source.

The switch signal source 12 supplies a signal sufficient to drive the transistors into saturation, the exact nature of the signal not being critical. However, one useful form of the invention is that in which the switch signal source 12 provides a signal 50 in the form of a series of spaced square waves so that the input signal is chopped. During the pulse application the input is permitted to travel to the output while during the intervening time period the output is zero.

As an alternate embodiment, the input signal may be applied by other means which produce minority carriers in the bulk material 20. This includes, for example, bombarding the contact 26 with electrons. This permits fabrication of a large array of devices to be sequentially switched by a scanning electron beam.

Without the third rectifying contact 26 and the ohmic contact 30 operation is possible with an optical switching signal where suitable modifications of the device structure are made to permit adequate numbers of carriers to be produced within a diffusion length of the junctions 23 and 25.

As beforesaid, the device of FIG. 1 operates as a single-pole, single throw switch, that is, it operates between one input and one output. However, a single-pole, multithrow switch operation is possible using a plurality of such devices and interconnecting one terminal of each so that any of a plurality of inputs appearing at the individual separate terminal can appear at the common terminal upon application of a switching signal to that device. Because of the symmetry of the devices, the opposite operation is possible wherein an input applied to the common terminal can be switched to any of the plurality of separate terminals upon application of a switching signal. Such interconnected device configurations are not preferred for multithrow operation unless the individual devices are so fabricated that their characteristics are substantially identical. Matching is desirable because then the switching signal does not have to be different for the different portions of the multithrow device.

One such device having the necessary characteristics for a multithrow switch will now be described in connection with FIGS. 3 and 4 which are specifically directed to a single-pole, double throw switch operation. The device of FIG. 3 comprises two portions 110 and 210 which are substantially identical with the device 10 of FIG. 1. The reference numerals of FIG. 3 correspond in their last two digits to those of the elements of FIG. 1. The second rectifying contact of the first device portion 110 and the first rectifying contact of the second device portion 210 are a common region 160. The desired matching characteristics are obtained by fabricating the device from a single piece of semiconductive material and removing material from the groove 170 so that the one rectifying contact 160 is common to both device portions 110 and 210.

Figure 3:
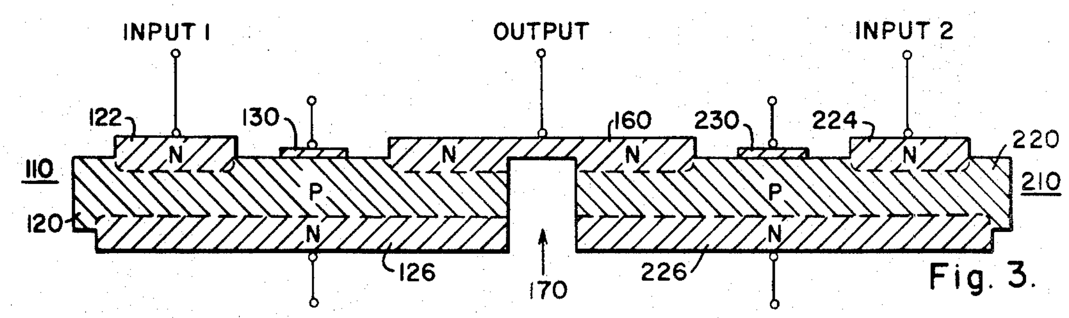
FIG. 3 is a cross sectional view of a device in accordance with another form of the invention.
Figure 4:
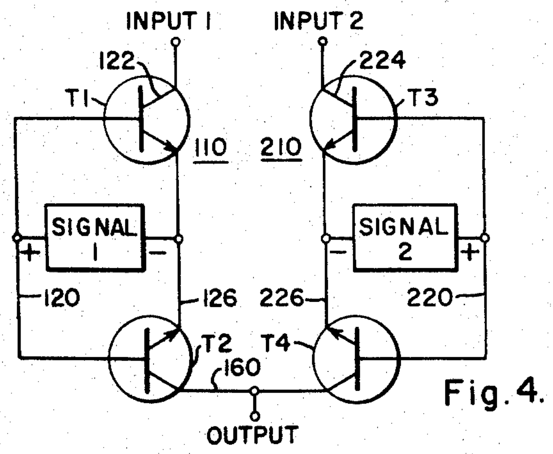
FIG. 4 is a schematic of the approximate equivalent circuit of the device of FIG. 3.

The biasing and switching circuits are omitted in FIG. 3 and may be applied to each device portion as in FIG. 1. The switching circuits are, however, shown in FIG. 4 for the common emitter configuration. The first device portion 110 is the equivalent of transistors T1 and T2 while the second device portion 210 is the equivalent of transistors T3 and T4. An input may be applied to the first rectifying contact 122 and to the fifth rectifying contact 224 with an output derived from the third rectifying contact 160 like that of either input depending on the presence of a switching signal to either device portion.

Two switch signal sources are not necessary for the operation of the single-pole, double throw switch. An alternative is to use the same interconnections except that the third rectifying contact 126 is connected to the second ohmic contact 230 and the first ohmic contact 130 is connected to the fifth rectifying contact 226 thus providing two terminals for the application of a voltage which if in a first direction causes a first device portion to be driven into saturation while the other device portion is driven into saturation while the other device portion is driven into cutoff. Upon application of the signal voltage of the opposite polarity, the reverse effect occurs. Therefore single-pole, double throw operation is possible with one switch signal source.

As an example, one form of the present invention will be described hereinafter in a semiconductive body of silicon. In addition to silicon, however, other semiconductive materials such as germanium or a semiconductive compound are suitable. For example, a compound of stoichiometric portions of elements from Group III of the Periodic Table, such as gallium, aluminum and indium, and elements from Group V of the Periodic Table, such as arsenic, phosphorus and antimony, may be used. Examples of suitable Group III–V stoichiometric compounds include gallium arsenide, gallium antimonide, gallium phosphide, indium arsenide and indium antimonide. A compound of two elements of Group IV of the Periodic Table such as silicon carbide or a compound of an element of Group II of the Periodic Table and an element of Group VI of the Periodic Table such as cadmium sulphide are also examples of suitable materials.

In describing the invention, devices are shown in which a particular type of semiconductivity is ascribed to each semiconductive region. However, the semiconductivity of the various regions may be reversed from that shown. Also, the inclusion of additional structural features within the same semiconductive device is satisfactory if the essential topological characteristics of the described regions are retained. For example, a high resistivity layer may be included in the structure shown to provide p-n-i-p or n-p-i-n type structures. In addition devices suitable for use in the practice of this invention may be incorporated in more extensive monolithic devices where a sufficient degree of electrical isolation is provided from other device portions.

The invention is specifically shown and described as embodied in devices made by the alloy fusion technique. However, this is only by way of illustration. Alloy fusion, vapor diffusion and epitaxial growth are examples of techniques which may be used in a variety of known processes. For example, with reference to FIG. 1, the common rectifying region 26 may be formed by alloy fusion and separate rectifying regions 22 and 24 formed by diffusion or both the base 20 and the separate rectifying regions 22 and 24 may be diffused into a starting wafer in which case there is formed a double diffused planar structure. FIGS. 5 to 8 illustrate the latter form wherein reference numerals are the same as those for the corresponding elements of FIG. 1. Elements 22, 24 and 26 of the alloyed device of FIG. 1 correspond to elements 22A and 22B, 24A and 24B and 26A and 26B, respectively, in FIGS. 5 to 8. Elements 22A, 24A and 26A are semiconductive regions and elements 22B, 24B and 26B are, respectively, ohmic contacts to those regions. In another form, the base 20 may be epitaxially deposited on the starting wafer with the rectifying regions 22 and 24 diffused therein.

There will now be described specific examples of the present invention which have been made and successfully operated. A starting wafer may be prepared by any of the known methods. For example, a single crystal silicon rod may be pulled from a melt comprised of silicon and at least one element from Group III of the Periodic Table such as boron, to provide a p-type wafer. The wafer is then cut from the rod in any suitable manner such as by use of a diamond saw. The cut surface of the wafer may then be lapped or etched or both in order to produce a smooth surface after sawing. In addition, the semiconductor device of this invention may be prepared from a second of a dendritic crystal prepared in accordance with U.S. patent application Ser. No. 844,288, filed Oct. 5, 1959, now U.S. Pat. No. 3,031,403, issued Apr. 24, 1962, the assignee of which is the same as that of the present invention.

The size of the wafer prepared from a pulled crystal was 100 mils by 200 mils by 2 mils. The impurity doping concentration was adjusted to provide a resistivity in the wafer of from about 10 ohm centimeters to about 25 ohm centimeters. There were then positioned on the wafer alloy foils for the formation of the additional contacts. The contacts for the first, second and third rectifying regions 22, 24 and 26 were all of an alloy of gold including about 0.5 to 1 percent antimony with a thickness of about 2 mils. The ohmic contact 30 was of an alloy of gold including about 1 percent to 2 percent boron with a thickness of about 0.9 mils. After assembling the foils on the wafer the structure was heated at about 750° C. for 2 minutes to fuse the elements. Electrical leads were then attached to the various regions by soldering and the device was operated as shown in the circuit of FIG. 2 wherein the DC bias potential was 20 volts, the bias resistance was 5,000 ohms and the switch signal source was 1 to 4 ma.

It was found that the impedance of the device in the off condition was typically about 40 megohms, with greater than 100 megohms having been achieved in some devices, while the impedance in the on condition was typically about 20 ohms, with less than 10 ohms having been achieved in some devices. During the on condition the voltage drop across the terminals was of the order of a millivolt while in the off condition it was found potential differences of typically about 5 volts and in some devices up to 20 volts could be sustained. The switching time was of the order of 1 microsecond or less.

Fabrication of a single-pole, double throw switch like that of FIG. 3 was effected by substantially the same process with a longer wafer and more alloy foils with a groove etched partially between the two device portions after fusion.

While the present invention has been shown and described in certain forms only, it will be obvious to those skilled in the art that it is not so limited but is susceptible of various changes and modifications without departing from the spirit and scope thereof.

What is claimed is:

1. A semiconductor switch comprising a semiconductor body including first and second regions of opposite conductivity type separated by a p-n junction, a first ohmic contact on said first region, a second ohmic contact on said second region, said first and second contacts are separated by the combined thickness of said first and second region and said p-n junction and are substantially coaxial, first and second zones located in said second region and each being of opposite conductivity type to that of said second region, discrete ohmic contacts on said first and second zones, respectively, first biasing means connected to said discrete ohmic contacts and applying an input signal thereto to create a first current path solely within said second region between said discrete ohmic contacts, and second biasing means connected across said first and second ohmic contacts to create a second current path across said p-n junction between said first and second ohmic contacts to intersect substantially at right angles said first current path to switch the impedance of said first current path between high and low impedance states by changing the bias across said p-n junction.

2. A semiconductor switch as set forth in claim 1 wherein said first and second zones are on opposite sides of said second ohmic contact and spaced substantially the same distance therefrom.

* * * * *